United States Patent

Cayetano et al.

Patent Number: 5,240,881
Date of Patent: Aug. 31, 1993

[54] METHOD OF WIRING BETWEEN PACKAGE OUTPUTS AND HYBRID ELEMENTS

[75] Inventors: José Cayetano, Chaville; Alain Lemasson, Sevres; Rémy Mur, Montrouge, all of France

[73] Assignee: Thomson-CSF, Puteaux, France

[21] Appl. No.: 906,658

[22] Filed: Jun. 30, 1992

[30] Foreign Application Priority Data

Jul. 5, 1991 [FR] France .................. 91 08456

[51] Int. Cl.⁵ .......................................... H01L 21/60
[52] U.S. Cl. ...................... 437/209; 437/206; 437/220
[58] Field of Search ............... 437/209, 220, 206, 217, 437/216

[56] References Cited

U.S. PATENT DOCUMENTS

| H498 | 7/1988 | Keller et al. | |
|---|---|---|---|
| 4,558,510 | 12/1985 | Tani et al. | 437/209 |
| 4,751,199 | 6/1988 | Phy | 437/209 |
| 4,816,427 | 3/1989 | Dennis | 437/206 |
| 4,842,662 | 6/1989 | Jacobi | 437/209 |
| 4,891,333 | 1/1990 | Baba et al. | 437/209 |
| 4,987,100 | 1/1991 | McBride | 437/220 |
| 4,994,412 | 2/1991 | Kalfus et al. | 437/220 |
| 5,036,584 | 8/1991 | Beauregard | 437/209 |

FOREIGN PATENT DOCUMENTS

| 362547 | 4/1990 | European Pat. Off. |
| 2714483 | 10/1978 | Fed. Rep. of Germany . |
| 60-124854 | 7/1985 | Japan . |
| 60-202958 | 10/1985 | Japan . |
| 1-134888 | 5/1989 | Japan . |
| 2-246248 | 10/1990 | Japan . |
| 2-264459 | 10/1990 | Japan . |
| 3-064876 | 3/1991 | Japan . |
| 3-089597 | 4/1991 | Japan . |
| 8802929 | 4/1988 | World Int. Prop. O. . |

Primary Examiner—Brian E. Hearn
Assistant Examiner—Kevin M. Picardat
Attorney, Agent, or Firm—Oblon, Spivak, McClelland, Maier & Neustadt

[57] ABSTRACT

Each connection between a package output and an element to be wired is made by means of a conductive clip soldered to the output and to the element to be wired, the clip being constituted by a head and a tail provided with soldering alloy and being shaped beforehand and pre-positioned between the element and the output; the head of the clip getting plugged into the output.

5 Claims, 1 Drawing Sheet

METHOD OF WIRING BETWEEN PACKAGE OUTPUTS AND HYBRID ELEMENTS

BACKGROUND OF THE INVENTION

The present invention relates to the encapsulation of hybrid circuits in a package. It relates, more particularly, to a method of wiring between outputs of the package and constituent elements of the hybrid circuit, namely screen-printed tracks, passive components or semiconductor components for example. It can be applied notably to power hybrid circuits where the wiring at the package outputs calls for large-sectioned wires. It can be applied more particularly to power electronics applications that are subject to constraints of limited availability of space, as in the automobile, aeronautical and space sectors.

The metal packages designed for power hybrid circuits are deep. This complicates the wiring in the vicinity of the edges of the package and, more particularly, at the outputs. Besides, for reasons of reliability, the connection wires between the outputs and the elements to be wired should follow a certain radius of curvature that is sufficiently large. This constraint introduces a loss of space at the edges of the package. This loss is further accentuated by the fact that a connection zone is needed between the outputs of the package and the components, notably in the case of ultrasonic soldering, for reasons of compatibility among materials. Ultrasonic soldering is used because it is easy to implement, particularly in that the use of soldering irons is avoided.

These problems are further complicated by the circulation of the strong currents which, in certain cases, dictate a great increase in the number of connection wires. Finally, in the case of packages with small surface areas such as packages of the TO254 type manufactured by the firm XERAM for example, these problems become acute and jeopardize the manufacture of the hybrid circuits.

However, several approaches can be used to resolve these problems. A first approach consists in replacing the large-sectioned connection wire by several smaller-sectioned wires which can tolerate a smaller radius of curvature. However, the size of the connection zones limits the number of these wires and the space gained is not sufficient. Furthermore, the wiring of several wires in parallel increases manufacturing costs. A second approach enables the elimination of the connection zone, hence provides a gain in surface area since the connection wire is wired directly between the output of the package and the component or its receiving zone which is generally made of gold-platinum. Nevertheless, in this case, it is not possible to carry out the soldering operations by ultrasonic means. For, this method calls for gold surfaces. It is therefore necesssary to resort to a standard type of soldering. Now, the height of the package prevents the introduction of the soldering iron in the vicinity of the edges and even prevents the soldering when the packages have an excessively small surface area. In fact, in order to keep within the dictated availability of space, the current approach consists in using aluminium connection wires, having a diameter that is sufficient for the currents brought into play, with very small radii of curvature, at the limits of reliability. It is difficult to shape these wires. The wirings thus made are then tested in order to show up the ones that are defective. The yield obtained is clearly very poor. Besides, this method calls for two operations of deposition, one of gold for the wiring and the other of gold-platinum for the soldering of the ceramic substrates and components.

This method therefore calls for an operation for the mounting of the hybrid circuit by soldering and then a wiring operation carried out by specific and costly machines.

The aim of the invention is to overcome the above-mentioned drawbacks.

SUMMARY OF THE INVENTION

To this end, an object of the invention is a method of wiring between package outputs and hybrid elements contained in this package, wherein each connection between an output and an element to be wired is made by means of a conductive clip soldered to the output and to the element to be wired, the clip being constituted by a head and a tail provided with soldering alloy and being shaped beforehand and pre-positioned between the element to be wired and the output of the package, the head of the clip getting plugged into the output of the package of hybrid elements.

The main advantages of the invention are that it:

enables the wiring of the outputs of the package to elements located as close as possible to the edges of the package, hence the resolution of the problems of space requirement raised by power hybrid circuit packages, notably those having small surface areas, permits direct wiring to the semiconductor chips, requires only one deposition, of gold-platinum for example, requires only one operation to do both the mounting and the wiring, makes it possible to have only one large-sectioned connection for the major currents, facilitates the shaping of the connections, does not require any specific machine and, finally, provides very high manufacturing efficiency while at the same time reducing the corresponding costs.

BRIEF DESCRIPTION OF THE DRAWING

Other features and advantages of the invention shall appear from the following description, made with reference to the appended drawing, wherein.

DESCRIPTION OF THE INVENTION

Figure 1A:
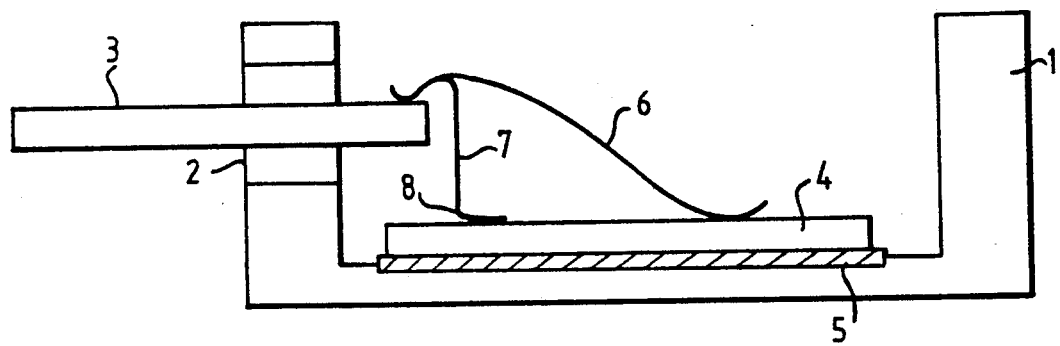
FIG. 1a shows profiles of wiring.
Figure 1B:
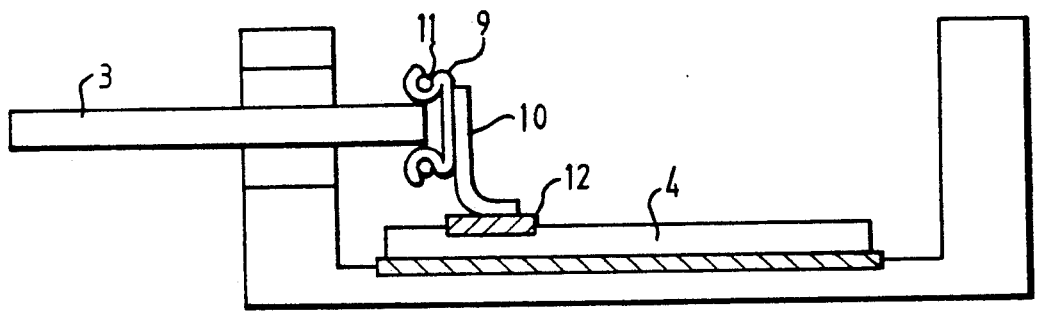
FIG. 1b shows a first possible type of wiring in accordance with the method according to the invention.

FIG. 1a shows a sectional view of the package 1, provided with a glass pearl 2 through which an output pin 3 is fixed. A ceramic substrate 4 is fixed to the edge of the package by means of a soldering 5 which is tin-based for example. The wire 6 correspond to an accurate and reliable wiring between an output pin 3 and a screened-printed element of the substrate 4 for example but, in this case, it does not meet the constraints of space availability. The wiring 7 meets these constraints, but the wire is embrittled at the heel 8. The method according to the invention makes it possible to preserve this wiring profile 7 without any risk of embrittlement as can be seen in FIG. 1b. According to this method, this wire 7 is replaced by a conductive clip shaped beforehand and constituted by a head 9 that can be plugged, with or without clearance, into the output pin 3 and a flexible tail 10 in contact with the element to be wired, for example in the present case a receiving zone screen-printed on the substrate 4 connected to a semiconductor component not shown in the figure. After shaping, the clip is provided with soldering alloy on its head and on its tail, then pre-positioned between the output pin 3 and the element of the substrate 4 to be connected. During the mounting phase, the clip keeps its position through the spring effect exerted by its tail 10. The soldering alloy used may be the same as that used for the substrates or the components: it may be a tin-based soldering alloy. This operation for the pre-positioning of the clip or clips is done in parallel to the other operations for the mounting of the other elements of the hybrid package. Once these operations are over, the entire hybrid package may be placed in a furnace for example. The soldering between the clip and the elements to be connected is then obtained by the remelting of the soldering alloy. FIG. 1b shows a sectional view of the soldering 11 between the head 9 of the clip and the output pin 3, and of the soldering 12 between the tail 10 of the clip and the zone of the substrate 4. In this exemplary embodiment, the head 9 of the clip has the shape of a clamp. During the remelting, the soldering 11 flows on the pin 3. It can be clearly seen that the method according to the invention enables a mounting/wiring operation which requires only one type of deposition for the soldering alloys and only one passage in the furnace.

Figure 1C:
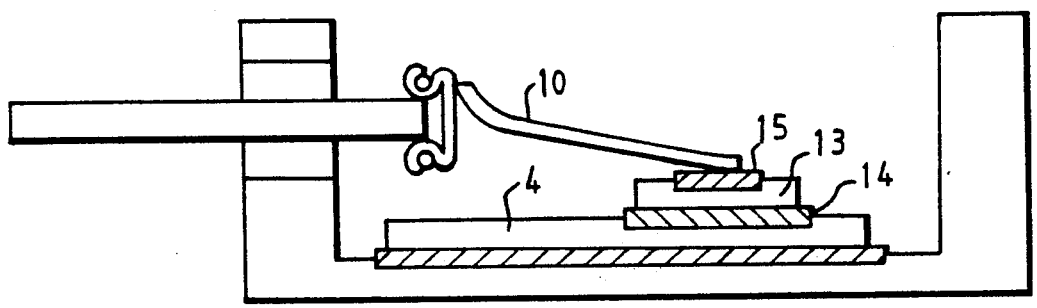
FIG. 1c shows a second possible type of wiring in accordance with the method according to the invention.

FIG. 1c shows a second possible type of wiring in accordance with the method according to the invention. In this case, the tail 10 of the clip is in direct contact with the element 13 to be wired which may be a passive component or a semiconductor component for example. As in the previous example, the clip is first of all shaped and then pre-positioned during the mounting operation. The component 13 is fixed to the substrate 4 by the soldering 14. The tail 10 of the clip is fixed to the component by the soldering 15 obtained by remelting. This approach enables the elements to be wired very close to the edge of the package. These elements may be notably semiconductor chips. The clip may be made of copper-beryllium for example.

What is claimed is:

1. A method of wiring between package outputs and hybrid elements contained in this package, wherein each connection between an output and an element to be wired is made by means of a conductive clip soldered to the output and to the element to be wired, the clip being constituted by a head and a tail provided with soldering alloy and being shaped beforehand and pre-positioned between the element to be wired and the output of the package, the head of the clip getting plugged into the output of the package of hybrid elements.

2. A method according to claim 1, wherein the clip is held during the pre-positioning phase by spring effect exerted by the tail of the clip.

3. A method according to claim 1, wherein the soldering between the clip and the elements to be wired, on the one hand, and the output, on the other hand, is obtained by remelting.

4. A method according to claim 1, wherein the element to be wired may be a semiconductor chip.

5. A method according to claim 1, wherein the deposit of soldering alloy on the clip is tin-based.

* * * * *